United States Patent
Shin et al.

(10) Patent No.: US 10,783,832 B2
(45) Date of Patent: Sep. 22, 2020

(54) SCAN DRIVER AND DISPLAY DEVICE INCLUDING THE SAME

(71) Applicant: Samsung Display Co., Ltd., Yongin-si (KR)

(72) Inventors: Kyoung Ju Shin, Yongin-si (KR); Cheol Gon Lee, Yongin-si (KR); Sang Uk Lim, Yongin-si (KR); Chang Yong Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 15/844,618

(22) Filed: Dec. 17, 2017

(65) Prior Publication Data

US 2018/0190204 A1 Jul. 5, 2018

(30) Foreign Application Priority Data

Jan. 5, 2017 (KR) ........................ 10-2017-0001849

(51) Int. Cl.
*G09G 3/3266* (2016.01)
*G09G 3/325* (2016.01)
(Continued)

(52) U.S. Cl.
CPC ..... *G09G 3/3266* (2013.01); *G02F 1/134336* (2013.01); *G09G 3/325* (2013.01); *G09G 3/3275* (2013.01); *G09G 3/3677* (2013.01); *G11C 19/28* (2013.01); *G09G 2300/0426* (2013.01); *G09G 2300/0819* (2013.01); *G09G 2310/0216* (2013.01); *G09G 2310/0251* (2013.01);
(Continued)

(58) Field of Classification Search
CPC .. G09G 3/3266; G09G 3/3677; G09G 3/3275; G09G 3/325; G09G 2310/0267; G09G 2300/0426; G09G 2310/0289; G09G 2310/0286; G09G 2310/0251; G09G 2310/0216; G09G 2300/0819; G09G 2310/0264; G02F 1/134336; G11C 19/28
See application file for complete search history.

(56) References Cited

U.S. PATENT DOCUMENTS 6,124,603 A 9/2000 Koyama et al.
6,639,575 B1 * 10/2003 Tsunashima ......... G09G 3/3648
257/204
(Continued)

FOREIGN PATENT DOCUMENTS

KR 10-0756125 8/2007
KR 10-2015-0089299 8/2015
(Continued)

*Primary Examiner* — Patrick N Edouard
*Assistant Examiner* — Joseph P Fox
(74) *Attorney, Agent, or Firm* — H.C. Park & Associates, PLC

(57) ABSTRACT

A scan driver, includes a plurality of stage circuits, each of which includes a driving circuit unit providing an output signal and an inverter inverting the output signal of the driving circuit unit and generating a scan signal, in which the inverter includes a first transistor and a second transistor, which are complementarily operated, the first transistor is a P-type polysilicon transistor, and the second transistor is an N-type oxide semiconductor transistor. A display device may include the scan driver.

8 Claims, 8 Drawing Sheets

(51) Int. Cl.
*G09G 3/3275* (2016.01)
*G02F 1/1343* (2006.01)
*G09G 3/36* (2006.01)
*G11C 19/28* (2006.01)

(52) U.S. Cl.
CPC ............... *G09G 2310/0267* (2013.01); *G09G 2310/0286* (2013.01); *G09G 2310/0289* (2013.01)

(56) References Cited

U.S. PATENT DOCUMENTS

| | | | |
|---|---|---|---|
| 7,619,239 B2* | 11/2009 | Irisawa | H01L 21/84 |
| | | | 257/19 |
| 2002/0043693 A1* | 4/2002 | Tiwari | G11C 16/0441 |
| | | | 257/392 |
| 2008/0036706 A1* | 2/2008 | Kitazawa | G09G 3/3233 |
| | | | 345/76 |
| 2014/0131703 A1 | 5/2014 | Miyamoto et al. | |
| 2015/0108482 A1* | 4/2015 | Kim | H01L 27/3276 |
| | | | 257/71 |
| 2015/0187247 A1* | 7/2015 | Lee | G09G 3/20 |
| | | | 345/205 |
| 2015/0214250 A1 | 7/2015 | Yang et al. | |
| 2015/0263722 A1* | 9/2015 | Kim | H03K 17/162 |
| | | | 315/161 |
| 2018/0005572 A1 | 1/2018 | Ka et al. | |
| 2018/0006099 A1 | 1/2018 | Ka et al. | |

FOREIGN PATENT DOCUMENTS

| | | |
|---|---|---|
| KR | 10-2018-0004369 | 1/2018 |
| KR | 10-2018-0004370 | 1/2018 |

* cited by examiner

SCAN DRIVER AND DISPLAY DEVICE INCLUDING THE SAME

CROSS-REFERENCE TO RELATED APPLICATION

This application claims priority from and the benefit of Korean Patent Application No. 10-2017-0001849, filed on Jan. 5, 2017, which is hereby incorporated by reference for all purposes as if fully set forth herein.

BACKGROUND

Field

Exemplary embodiments relate to a scan driver, and a display device including the same.

Discussion of the Background

According to development of information technology, importance of a display device, which is a connection medium between a user and information, has increased. In response to this, a usage of the display device, such as a liquid crystal display device and an organic light emitting display device, has been increased.

In general, the display device includes a data driver for supplying a data signal to data lines, a scan driver for supplying a scan signal to scan lines, and a plurality of pixels connected to the scan lines and the data lines.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a scan driver, which includes an inverter inverting and outputting an output signal to a driving circuit unit, and a display device including the same.

Additional aspects will be set forth in the detailed description which follows, and, in part, will be apparent from the disclosure, or may be learned by practice of the inventive concepts.

According to exemplary embodiments, a scan driver, includes: a plurality of stage circuits, each of which includes a driving circuit unit providing an output signal and an inverter inverting the output signal of the driving circuit unit and generating a scan signal, in which the inverter includes a first transistor and a second transistor, which are complementarily operated, the first transistor is a P-type polysilicon transistor, and the second transistor is an N-type oxide semiconductor transistor.

The first transistor may be connected between a common node and a first driving power source, the second transistor may be connected between the common node and a second driving power source, and the common node may be electrically connected with a scan line outputting the scan signal.

A channel width of the second transistor may be larger than a channel width of the first transistor.

A channel length of the second transistor may be smaller than a channel width of the first transistor.

The second transistor may be a double gate transistor including two gate electrodes.

The output signal may include a low level pulse, and the scan signal may include a high level pulse.

The driving circuit unit may include a plurality of transistors having the same conductive type.

Another exemplary embodiment of the present disclosure provides a display device, including: pixels connected with first scan lines and data lines; a scan driver including stage circuits supplying scan signals to the first scan lines; and a data driver configured to supply data signals to the data lines, in which each of the stage circuits includes: a driving circuit unit configured to provide an output signal; and an inverter configured to invert the output signal of the driving circuit unit and generate a scan signal, and the inverter includes a first transistor and a second transistor, which are complementarily operated, the first transistor is a P-type polysilicon transistor, and the second transistor is an N-type oxide semiconductor transistor.

The first transistor may be connected between a common node and a first driving power source, the second transistor may be connected between the common node and a second driving power source, and the common node may be electrically connected with a first scan line outputting the scan signal.

A channel width of the second transistor may be larger than a channel width of the first transistor.

A channel length of the second transistor may be smaller than a channel width of the first transistor.

The second transistor may be a double gate transistor including two gate electrodes.

The driving circuit unit may include a plurality of transistors having the same conductive type.

Each of the pixels may include one or more polysilicon transistors and one or more oxide semiconductor transistors, and each of the oxide semiconductor transistors included in the pixels may receive the scan signal through the first scan line.

The polysilicon transistors included in the pixels may be P-type transistors, and the oxide semiconductor transistors included in the pixels may be N-type transistors.

The output signal may include a low level pulse, and the scan signal may include a high level pulse.

The display device may further include second scan lines connected with the pixels, and the driving circuit units included in the stage circuits may supply the output signals to the second scan lines.

Each of the pixels may include one or more polysilicon transistors and one or more oxide semiconductor transistors, each of the polysilicon transistors included in the pixels may receive the output signal of the driving circuit unit through the second scan line, and each of the oxide semiconductor transistors included in the pixels may receive the scan signal through the first scan line.

The output signal may include a low level pulse, and the scan signal may include a high level pulse.

The polysilicon transistors included in the pixels may be P-type transistors, and the oxide semiconductor transistors included in the pixels may be N-type transistors.

As described above, according to the exemplary embodiments of the present invention, it is possible to provide the scan driver including the inverter, which inverts an output signal of the driving circuit unit and outputs the inverted signal, and the display device including the same.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
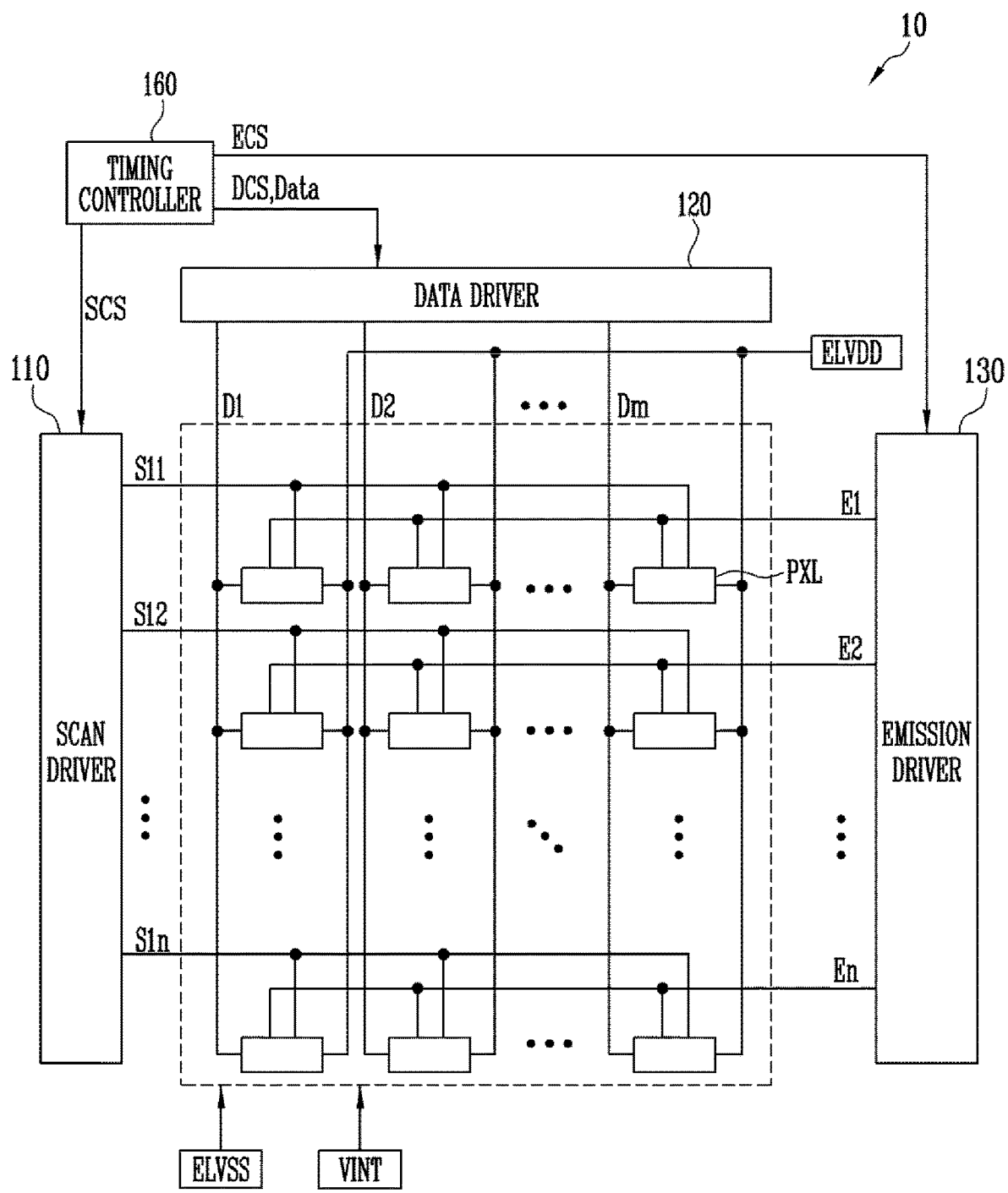
FIG. 1 is a diagram illustrating a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

FIG. 1 is a diagram illustrating a display device according to an exemplary embodiment of the present disclosure.

Referring to FIG. 1, a display device 10 according to the exemplary embodiment of the present disclosure may include pixels PXL, a scan driver 110, a data driver 120, an emission driver 130, and a timing controller 160.

The pixels PXL may be connected with first scan lines S11 to S1n, emission control lines E1 to En, and data lines D1 to Dm.

Further, the pixels PXL may be connected with a first pixel power source ELVDD, a second pixel power source ELVSS, and a third pixel power source VINT.

The pixels PXL may receive scan signals from the first scan lines S11 to S1n, and may receive data signals synchronized with the scan signals from the data lines D1 to Dm.

The pixels PXL receiving the data signals may control the quantity of current flowing from the first pixel power source ELVDD to the second pixel power source ELVSS via an organic light emitting diode (not illustrated), and in this case, the organic light emitting diode may generate light having luminance corresponding to the level of current.

The scan driver 110 may supply scan signals to the first scan lines S11 to S1n in response to a scan driver control signal SCS from the timing controller 160.

For example, the scan driver 110 may sequentially supply the scan signals to the scan lines S11 to S1n. When the scan signals are sequentially supplied to the scan lines S11 to S1n, the pixels PXL may be sequentially selected in the unit of a horizontal line.

In this case, the scan signal may have a voltage level, with which a transistor receiving the scan signal may be turned on.

The emission driver 130 may supply emission control signals to the emission control lines E1 to En in response to the emission driver control signal ECS from the timing controller 160.

For example, the emission driver 130 may sequentially supply the emission control signals to the emission control lines E1 to En.

In this case, the emission control signal may have a voltage level, with which a transistor receiving the emission control signal may be turned off.

The data driver 120 may supply data signals to the data lines D1 to Dm in response to a data driver control signal DCS.

The data signals supplied to the data lines D1 to Dm may be supplied to the pixels PXL selected by the respective scan signals.

To this end, the data driver 120 may supply the data signals D1 to Dm while synchronizing the data signals D1 to Dm with the scan signals.

The timing controller 160 may generate the data driver control signal DCS, a scan driver control signal SCS, and an emission driver control signal ECS in response to control signals supplied from the outside.

In this case, the scan driver control signal SCS may be supplied to the scan driver 110, the data driver control signal DCS may be supplied to the data driver 120, and the emission driver control signal ECS may be supplied to the emission driver 130.

Further, the timing controller 160 may convert image data input from the outside into image data Data satisfying a specification of the data driver 120, and may supply the image data Data to the data driver 120.

The scan driver control signal SCS may include a scan start pulse and clock signals. The scan start pulse may control a supply timing of the scan signals, and the clock signals may be used for shifting the scan start pulse.

The emission driver control signal ECS may include an emission start pulse and clock signals. The emission start pulse may control a supply timing of the emission control signals, and the clock signals may be used for shifting the emission start pulse.

The data driver control signal DCS may include a source start pulse, a source output enable signal, a source sampling clock, and the like. The source start pulse may control a data sampling start time of the data driver 120. The source sampling clock may control a sampling operation of the data driver 120 based on a rising or falling edge. The source output enable signal may control an output timing of the data driver 120.

In the meantime, FIG. 1 illustrates n first scan lines S11 to S1n and n emission control lines E1 to En, but the present disclosure is not limited thereto. For example, for stability of the driving, dummy scan lines and/or dummy emission control lines may be additionally formed.

Further, FIG. 1 separately illustrates the scan driver 110, the data driver 120, the emission driver 130, and the timing controller 160, but at least a part of these elements may be combined as necessary.

The scan driver 110, the data driver 120, the emission driver 130, and the timing controller 160 may be installed by various methods, such as chip on class, chip on plastic, tape carrier package, and chip on film.

Further, when the pixels PXL have a structure, in which it is not necessary to use the emission control signal, the emission driver 130 and the emission control lines E1 to En may be omitted.

Figure 2:
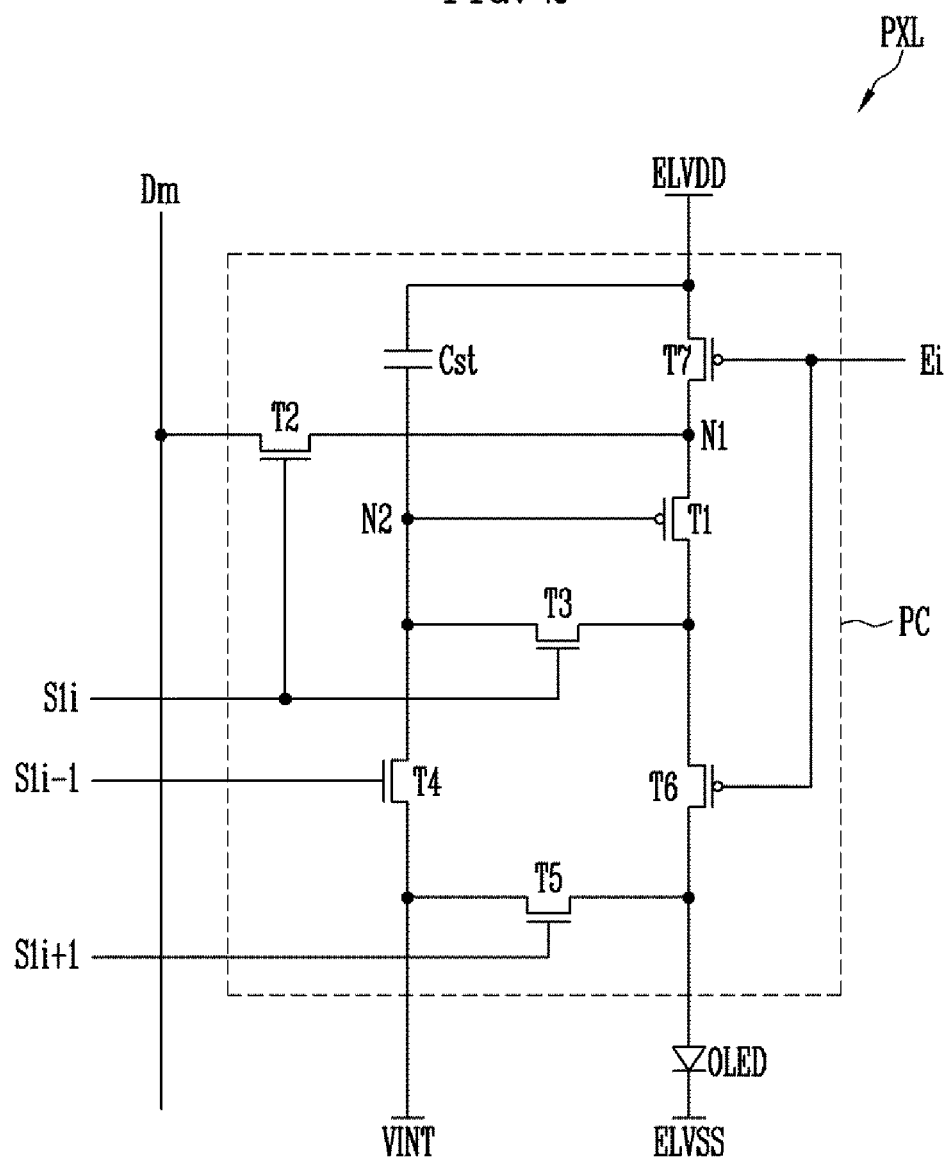
FIG. 2 is a diagram illustrating a pixel according to an exemplary embodiment of the present disclosure.

FIG. 2 is a diagram illustrating the pixel according to the exemplary embodiment of the present disclosure.

For convenience of the description, FIG. 2 illustrates the pixel PXL connected to the $m^{th}$ data line Dm and the $i^{th}$ first scan line S1$i$.

Referring to FIG. 2, the pixel according to the exemplary embodiment of the present disclosure may include at least one oxide semiconductor transistor and at least one polysilicon transistor.

The oxide semiconductor transistor includes a gate electrode, a source electrode, a drain electrode, and an active layer which is formed of an oxide semiconductor. Here, the oxide semiconductor may be set to be amorphous or crystalline. Further, the oxide semiconductor transistor may be formed of an N-type transistor.

A low temperature process may be performed on the oxide semiconductor transistor, and the oxide semiconductor transistor has lower charge mobility than that of a polysilicon transistor. The oxide semiconductor transistor has an excellent off current characteristic.

For example, the oxide semiconductor may include any one of an oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxide thereof including a zinc oxide (ZnO), an indium-gallium-zinc oxide (In—Ga—Zn—O), an indium-zinc oxide (In—Zn—O), a zinc-tin-oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O).

The polysilicon transistor includes a gate electrode, a source electrode, a drain electrode, and an active layer which is formed of polysilicon. For example, the polysilicon transistor may be set with low temperature polysilicon. The polysilicon transistor may be formed of a P-type transistor or an N-type transistor. In the exemplary embodiment of the present disclosure, it is assumed that the polysilicon transistor is formed of a P-type transistor.

The polysilicon transistor has high charge mobility, thereby having a rapid driving characteristic.

Referring to FIG. 2, the pixel PXL according to the exemplary embodiment of the present disclosure may include a pixel circuit PC and an organic light emitting diode OLED.

An anode electrode of the organic light emitting diode OLED may be connected to the pixel circuit PC, and a cathode electrode thereof may be connected to the second pixel power source ELVSS.

The organic light emitting diode OLED may generate light with predetermined luminance in response to the quantity of current supplied from the pixel circuit PC.

The first pixel power source ELVDD may be set with a higher voltage than that of the second pixel power source ELVSS so that a current may flow to the organic light emitting diode OLED.

The pixel circuit PC may control the quantity of current flowing from the first pixel power source ELVDD to the second pixel power source ELVSS via the organic light emitting diode OLED in response to the data signal. To this end, the pixel circuit PC may include a first transistor T1, a second transistor T2, a third transistor T3, a fourth transistor T4, a fifth transistor T5, a sixth transistor T6, a seventh transistor T7, and a storage capacitor Cst.

A first electrode of the first transistor T1 (driving transistor) may be connected to the first node N1, and a second electrode of the first transistor T1 may be connected to a first electrode of the sixth transistor T6. Further, a gate electrode of the first transistor T1 may be connected to a second node N2. The first transistor T1 may control the quantity of current flowing from the first pixel power source ELVDD to the second pixel power source ELVSS via the organic light emitting diode OLED in response to a voltage stored in the storage capacitor Cst. In order to secure a rapid driving speed, the first transistor T1 may be formed of a polysilicon transistor. Further, the first transistor T1 may be formed of a p-type transistor.

The second transistor T2 may be connected between an $m^{th}$ data line Dm and the first node N1. Further, a gate electrode of the second transistor T2 may be connected to an $i^{th}$ first scan line S1$i$. The second transistor T2 may be turned on when a scan signal is supplied to the $i^{th}$ first scan line S1$i$ to electrically connect the $m^{th}$ data line Dm and the first node N1.

The second transistor T2 may be formed of an oxide semiconductor transistor. In this case, the second transistor T2 may be formed of an N-type transistor. When the second transistor T2 is formed of an oxide transistor, an unnecessary current flow between the first node N1 and the $m^{th}$ data line Dm may be minimized.

The third transistor T3 may be connected between a second electrode of the first transistor T1 and the second node N2. Further, a gate electrode of the third transistor T3 may be connected to the $i^{th}$ first scan line S1$i$. The third transistor T3 may be turned on when a scan signal is supplied to the $i^{th}$ first scan line S1$i$ to electrically connect the first transistor T1 in a diode form.

The third transistor T3 may be formed of an oxide semiconductor transistor. In this case, the third transistor T3 may be formed of an N-type transistor. When the third transistor T3 is formed of an oxide semiconductor transistor, a leakage current flowing from the second node N2 to the second electrode of the first transistor T1 is minimized, thereby displaying an image of desired luminance.

The fourth transistor T4 may be connected between the second node N2 and the third pixel power source Vint. Further, a gate electrode of the fourth transistor T4 may be connected to an $i-1^{th}$ first scan line S1$i$-1. The fourth transistor T4 may be turned on when a scan signal is supplied to the $i-1^{th}$ first scan line S1$i$-1 to supply the voltage of the third pixel power source VINT to the second node N2.

The fourth transistor T4 may be formed of an oxide semiconductor transistor. In this case, the fourth transistor T4 may be formed of an N-type transistor. When the fourth transistor T4 is formed of an oxide semiconductor transistor, a leakage current flowing from the second node N2 to the third pixel power source VINT is minimized, thereby displaying an image of desired luminance.

The fifth transistor T5 may be connected between the anode electrode of the organic light emitting diode OLED and the third pixel power source VINT. Further, a gate electrode of the fifth transistor T5 may be connected to an $i+1^{th}$ first scan line S1$i$+1. The fifth transistor T5 may be turned on when a scan signal is supplied to the $i+1^{th}$ first scan line S1$i$+1 to supply the voltage of the third pixel power source Vint to the anode electrode of the organic light emitting diode OLED.

According to the exemplary embodiment, the gate electrode of the fifth transistor T5 may be connected to the $i-1^{th}$ first scan line S1$i$-1 or the $i^{th}$ first scan line S1$i$.

The fifth transistor T5 may be formed of an oxide semiconductor transistor. The fifth transistor T5 may be formed of an N-type transistor. When the fifth transistor T5 is formed of an oxide semiconductor transistor, a leakage current flowing from the anode electrode of the organic light emitting diode OLED to the third pixel power source VINT during an emission period may be minimized.

In the meantime, the voltage of the third pixel power source VINT may be set with a voltage lower than the data signal. When the voltage of the third pixel power source VINT is supplied to the anode electrode of the organic light emitting diode OLED, a parasitic capacitor of the organic light emitting diode OLED is discharged. When an organic capacitor Coled is discharged, black expression performance of the pixel PXL may be improved.

The sixth transistor T6 may be connected between the second electrode of the first transistor T1 and the anode electrode of the organic light emitting diode OLED. Further, a gate electrode of the sixth transistor T6 may be connected to an $i^{th}$ emission control line Ei. The sixth transistor T6 may be turned off when an emission control signal is supplied to the $i^{th}$ emission control line Ei, and may be turned on when the emission control signal is not supplied.

The sixth transistor T6 may be formed of a polysilicon transistor. The sixth transistor T6 may be formed of a P-type transistor.

The seventh transistor T7 may be connected between the first pixel power source ELVDD and the first node N1. Further, a gate electrode of the seventh transistor T7 may be connected to the $i^{th}$ emission control line Ei. The seventh transistor T7 may be turned off when the emission control signal is supplied to the $i^{th}$ emission control line Ei, and may be turned on when the emission control signal is not supplied.

The seventh transistor T7 may be formed of a polysilicon transistor. The seventh transistor T7 may be formed of a P-type transistor.

The storage capacitor Cst may be connected between the first pixel power source ELVDD and the second node N2. The storage capacitor Cst may store a data signal and a voltage corresponding to a threshold voltage of the first transistor T1.

In the meantime, in the exemplary embodiment of the present disclosure, the second transistor T2, the third transistor T3, the fourth transistor T4, and the fifth transistor T5 are formed of the oxide semiconductor transistors, so that it is possible to minimize a leakage current, and thus the pixel PXL may emit light with normal luminance.

Further, in the exemplary embodiment of the present disclosure, the transistors T1, T6, and T7 positioned in a current supply path of the organic light emitting diode OLED may be formed of the polysilicon transistors. In this case, by the high speed driving characteristic of the polysilicon transistor, it is possible to stably supply a current to the organic light emitting diode OLED.

Further, the pixel structure described with reference to FIG. 2 simply corresponds to one example including the oxide semiconductor transistor and the polysilicon transistor, so that the pixel PXL of the present invention is not limited to the pixel structure.

In the present disclosure, the organic light emitting diode OLED may generate various light including red light, green light, or blue light in response to the quantity of current supplied from the driving transistor, but the organic light emitting diode OLED is not limited thereto. For example, the organic light emitting diode OLED may generate white light in response to the quantity of current supplied from the driving transistor. In this case, it is possible to implement a color image by using a separate color filter, and the like.

Figure 3:
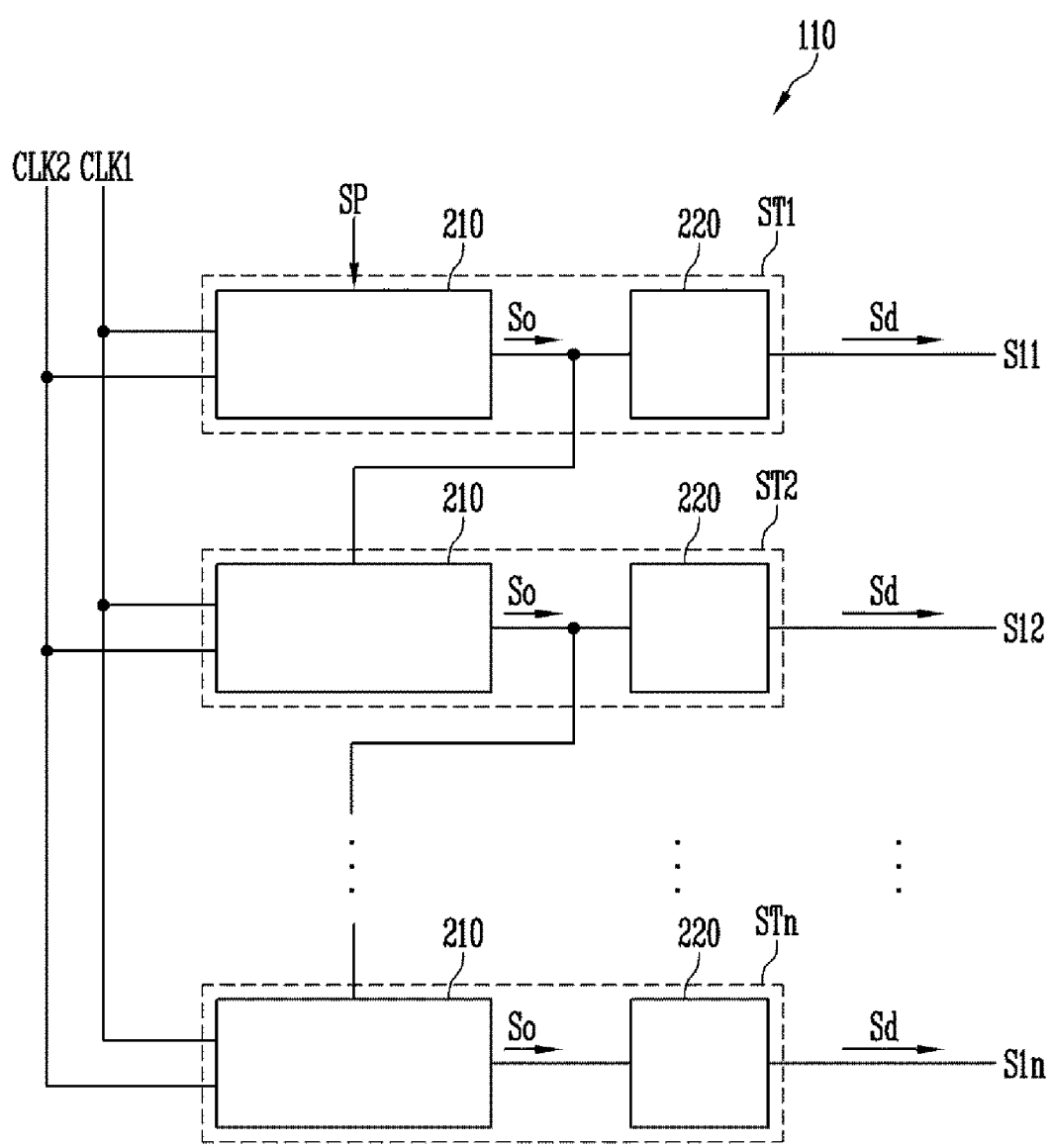
FIG. 3 is a diagram illustrating a scan driver according to an exemplary embodiment of the present disclosure in detail.

FIG. 3 is a diagram illustrating the scan driver according to the exemplary embodiment of the present disclosure in detail.

Referring to FIG. 3, the scan driver 110 may include a plurality of stage circuits ST1 to STn.

The stage circuits ST1 to STn may be connected to one ends of the first scan lines S11 to S1n, respectively, and may supply scan signals Sd to the first scan lines S11 to S1n.

Further, each of the stage circuits ST1 to STn may include a driving circuit unit 210 and an inverter 220.

In this case, the driving circuit units 210 may output signals So in response to clock signals CLK1 and CLK2 supplied from the timing controller 160.

Further, the driving circuit units 210 may receive a start pulse SP or the output signal So of the previous driving circuit unit 210.

For example, the driving circuit unit 210 included in the first stage circuit ST1 may receive the start pulse SP, and the driving circuit units 210 included in the remaining stage circuits ST2 to STn may receive the output signal So of the driving circuit unit 210 of the previous stage circuit.

According to the aforementioned operation, the driving circuit units 210 may sequentially output the output signals So.

Each of the inverters 220 may invert the output signals So supplied from the driving circuit units 210 and generate scan signals Sd, and output the generated scan signals Sd to the first scan lines S11 to S1n.

Figure 4:
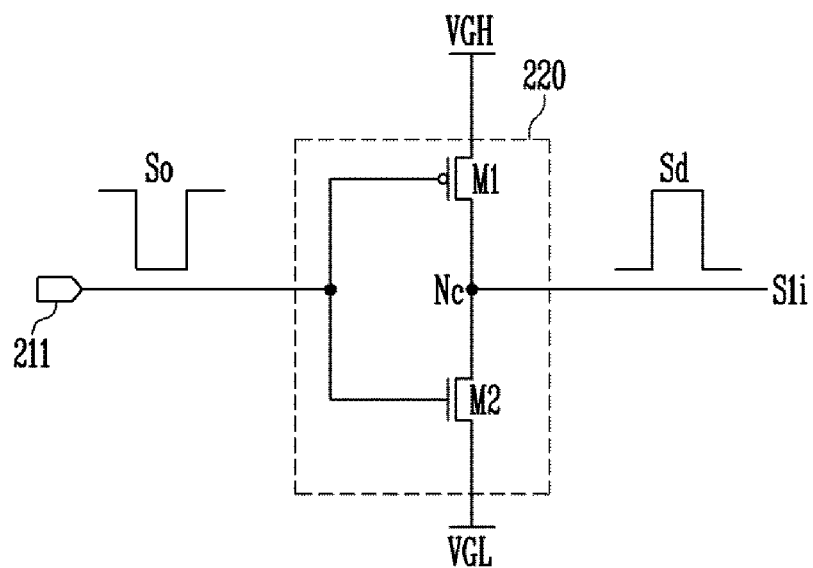
FIG. 4 is a diagram illustrating an inverter according to an exemplary embodiment of the present disclosure.

FIG. 4 is a diagram illustrating an inverter according to the exemplary embodiment of the present disclosure. Particularly, FIG. 4 illustrates an example of an inverter 220 connected to the $i^{th}$ first scan line S1i.

Referring to FIG. 4, the inverter 220 according to the exemplary embodiment of the present disclosure may include a first transistor M1 and a second transistor M2 which are complementarily operated.

In this case, the conductive types of the first transistor M1 and the second transistor M2 may be different set, and in this case, the inverter 220 may be operated as a CMOS inverter.

The first transistor M1 may be connected between a common node Nc and a first driving power source VGH.

Further, a gate electrode of the first transistor M1 may be connected to an output terminal 211 of the driving circuit unit 210, and the first transistor M1 may be formed of a P-type polysilicon transistor.

The second transistor M2 may be connected between the common node Nc and a second driving power source VGL.

Further, a gate electrode of the second transistor M2 may be connected to the output terminal 211 of the driving circuit unit 210, and the second transistor M2 may be formed of an N-type oxide semiconductor transistor.

In this case, the common node Nc may be electrically connected with the $i^{th}$ first scan line S1i.

Further, the first driving power source VGH may have a voltage of a high level, and the second driving power source VGL may have a voltage of a low level.

The inverter 220 may invert the output signal So supplied through the output terminal 211 of the driving circuit unit 210 and generate the scan signal Sd.

For example, when the output signal So including a pulse of a low level is supplied, the first transistor M1 may be turned on, and thus, the high level voltage of the first driving power source VGH may be applied to the common node Nc.

Further, when the supply of the output signal So is stopped, the high level voltage is applied to the gate electrodes of the first transistor M1 and the second transistor M2, and thus, the second transistor M2 may be turned on and the low level voltage of the second driving power source VGL may be applied to the common node Nc.

As a result, the scan signal Sd output to the common node Nc may include a high level pulse.

As described above, in order to minimize a leakage current, each pixel PXL may include one or more N-type oxide semiconductor transistors.

In this case, in order to turn on the N-type oxide semiconductor transistor, the scan signal including the high level pulse is required.

In one exemplary embodiment of the present invention, the inverters 220 are installed in the output terminals 211 of the driving circuit units 210 outputting the low level pulses, respectively, thereby easily generating the scan signal including the high level pulse.

Further, the inverter 220 of the present invention includes the oxide semiconductor transistor M2 having a small leakage current, thereby decreasing power consumption.

In the meantime, the oxide semiconductor transistor has lower mobility than that of the polysilicon transistor, so that a characteristic difference may be generated between the first transistor M1 and the second transistor M2.

Accordingly, in order to compensate for the difference in the mobility between the first transistor M1 and the second transistor M2, a channel width of the second transistor M2 may be set to be larger than a channel width of the first transistor M1.

Further, a channel length of the second transistor M2 may be set to be smaller than a channel length of the first transistor M1.

In this case, the mobility of the first transistor M1 may be equally set to the mobility of the second transistor M2, so that reliability of the inverter 220 may be improved.

Figure 5:
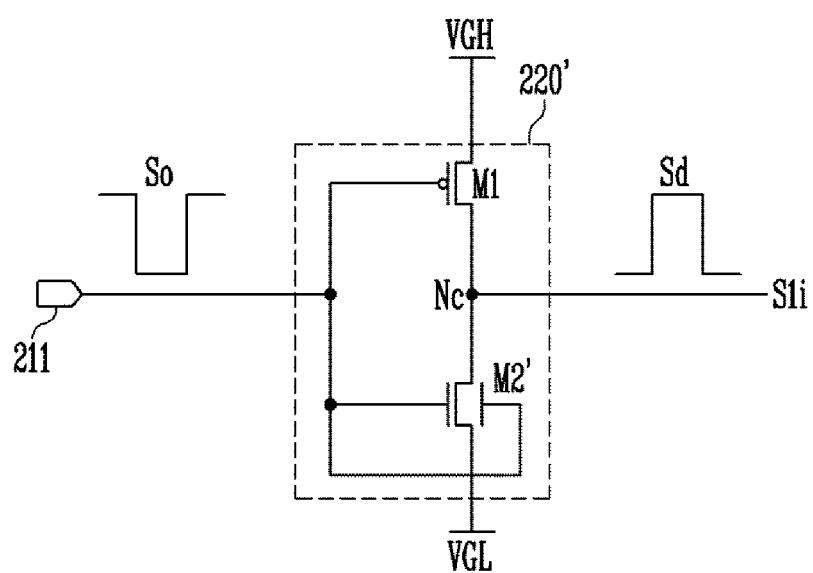
FIG. 5 is a diagram illustrating an inverter according to another exemplary embodiment of the present disclosure.

FIG. 5 is a diagram illustrating an inverter according to another exemplary embodiment of the present disclosure.

Referring to FIG. 5, an inverter 220' according to another exemplary embodiment of the present disclosure has a similar configuration to that of the inverter 220 illustrated in FIG. 4, but a second transistor M2' may be formed of a double gate transistor including two gate electrodes.

The double gate transistor may be formed by disposing two gate electrodes at both sides of an active layer. In the case of the double gate transistor, when the number of gate electrodes is increased, the mobility may be increased.

Accordingly, when the second transistor MT is formed of the double gate transistor, it is possible to compensate for a mobility difference between a first transistor M1 and the second transistor MT.

Figure 6:
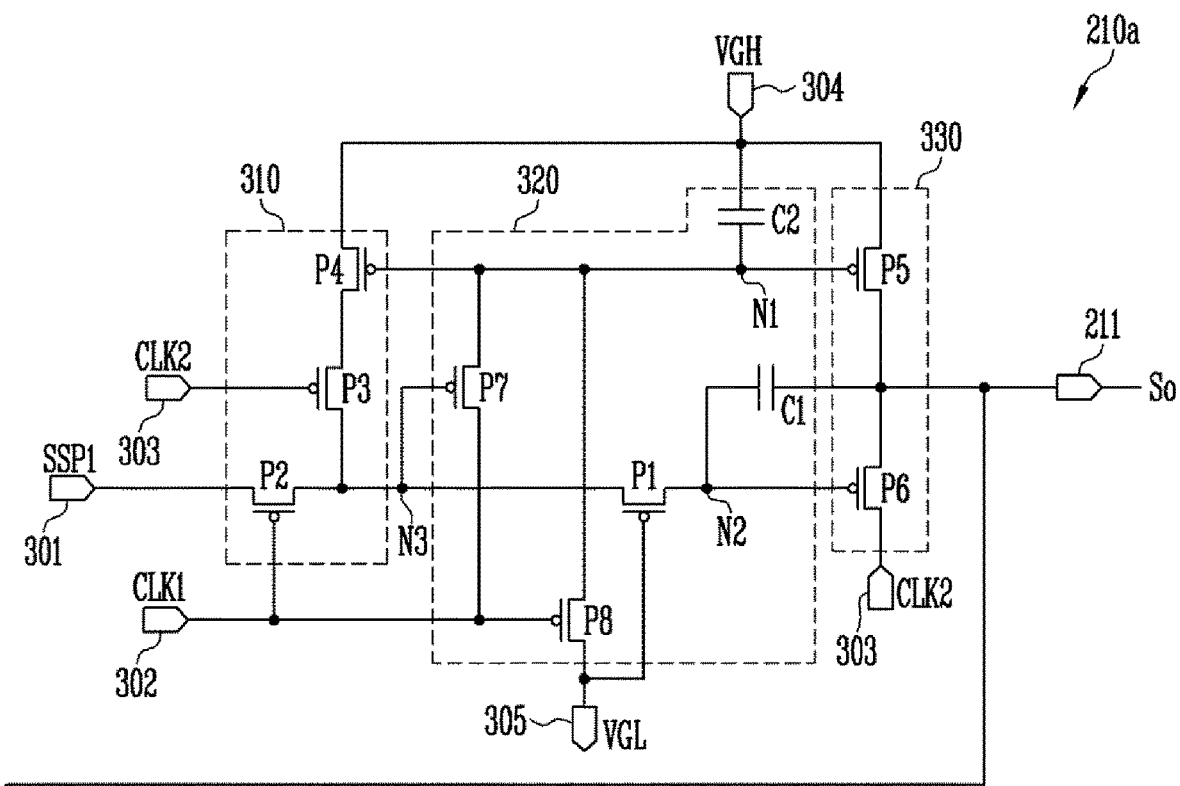
FIG. 6 is a diagram illustrating a driving circuit unit according to an exemplary embodiment of the present disclosure.
Figure 6:
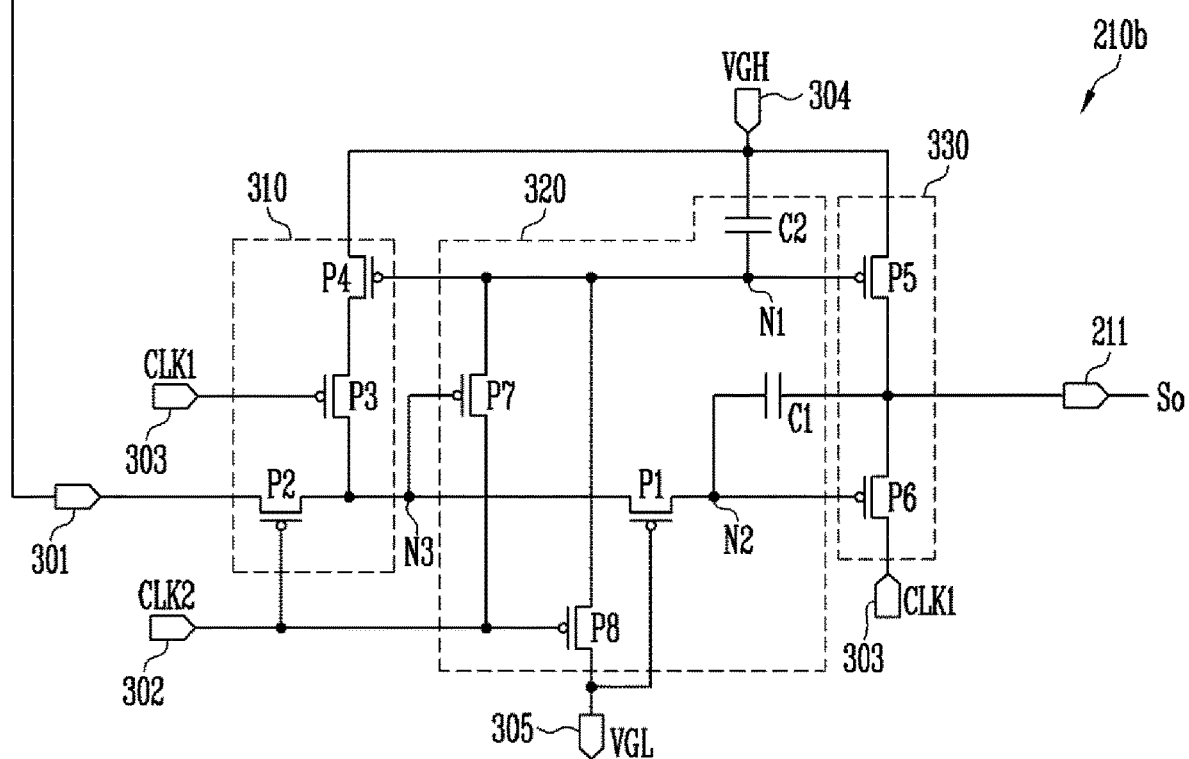

FIG. 6 is a diagram illustrating the driving circuit unit according to the exemplary embodiment of the present disclosure. For convenience of the description, FIG. 6 illustrates a driving circuit unit 210a included in the first stage circuit ST1 and a driving circuit unit 210b included in the second stage circuit ST2.

Referring to FIG. 6, the driving circuit unit 210a may include a first driving circuit 310, a second driving circuit 320, and an output unit 330.

The output unit 330 may control a voltage supplied to the output terminal 211 in response to the voltages of the first node N1 and the second node N2. To this end, the output unit 330 may include a fifth transistor P5 and a sixth transistor P6.

The fifth transistor P5 may be connected between a fourth input terminal 304, to which the first driving power source VGH is input, and the output terminal 211, and a gate electrode thereof may be connected to the first node N1. The fifth transistor P5 may control a connection of the fourth input terminal 304 and the output terminal 211 in response to the voltage applied to the first node N1.

The sixth transistor P6 may be connected between the output terminal 211 and the third input terminal 303, and a gate electrode thereof may be connected to the second node N2. The sixth transistor P6 may control a connection of the output terminal 211 and the third input terminal 303 in response to the voltage applied to the second node N2.

The first driving circuit 310 may control a voltage of the third node N3 in response to signals supplied to the first input terminal 301 to the third input terminal 303.

To this end, the first driving circuit 310 may include a second transistor P2, a third transistor P3, and a fourth transistor P4.

The second transistor P2 may be connected between the first input terminal 301 and the third node N3, and a gate electrode thereof may be connected to the second input terminal 302. The second transistor P2 may control a connection of the first input terminal 301 and the third node N3 in response to a signal supplied to the second input terminal 302.

The third transistor P3 and the fourth transistor P4 may be serially connected between the third node N3 and the fourth input terminal 304. In one example, the third transistor P3 may be connected between the fourth transistor P4 and the third node N3, and a gate electrode thereof may be connected to the third input terminal 303. The third transistor P3 may control a connection of the fourth transistor P4 and the third node N3 in response to a signal supplied to the third input terminal 303.

The fourth transistor P4 may be connected between the third transistor P3 and the fourth input terminal 304, and a gate electrode thereof may be connected to the first node N1. The fourth transistor P4 may control a connection of the third transistor P3 and the fourth input terminal 304 in response to a voltage applied to the first node N1.

The second driving circuit 320 may control a voltage of the first node N1 in response to the voltages of the second input terminal 302 and the third node N3. To this end, the second driving circuit 320 may include a first transistor P1, a seventh transistor P7, an eighth transistor P8, a first capacitor C1, and a second capacitor C2.

The first capacitor C1 may be connected between the second node N2 and the output terminal 211. The first capacitor C1 charges a voltage corresponding to turn-on and turn-off of the sixth transistor P6.

The second capacitor C2 may be connected between the first node N1 and the fourth input terminal 304. The second capacitor C2 may charge a voltage applied to the first node N1.

The seventh transistor P7 may be connected between the first node N1 and the second input terminal 302, and a gate electrode thereof may be connected to the third node N3. The seventh transistor P7 may control a connection of the first node N1 and the second input terminal 302 in response to a voltage applied to the third node N3.

The eighth transistor P8 may be positioned between the first node N1 and a fifth input terminal 305, to which the second driving power source VGL is supplied, and a gate electrode thereof may be connected to the second input terminal 302. The eighth transistor P8 may control a connection of the first node N1 and the fifth input terminal 305 in response to a signal supplied to the second input terminal 302.

The first transistor P1 may be connected between the third node N3 and the second node N2, and a gate electrode thereof may be connected to the fifth input terminal 305. The first transistor P1 may maintain an electrical connection of the third node N3 and the second node N2 while maintaining a turn-on state. In addition, the first transistor P1 may restrict a voltage drop width of the third node N3 in response to a voltage of the second node N2. That is, even though the voltage of the second node N2 is dropped to a voltage lower than that of the second driving power source VGL, the voltage of the third node N3 is not decreased below the voltage, which is obtained by subtracting a threshold voltage of the first transistor P1 from the second driving power source VGL.

The driving circuit unit 210b included in the second stage circuit ST2 may have the same configuration as that of the aforementioned driving circuit unit 210a.

Further, a second input terminal 302 of an $j^{th}$ (j is an odd number or an even number) stage circuit STj may receive the first clock signal CLK1, and a third input terminal 303 thereof may receive the second clock signal CLK2. A second input terminal 302 of an $j+1^{th}$ stage circuit STj+1 may receive the second clock signal CLK2, and a third input terminal 303 thereof may receive the first clock signal CLK1.

Figure 7:
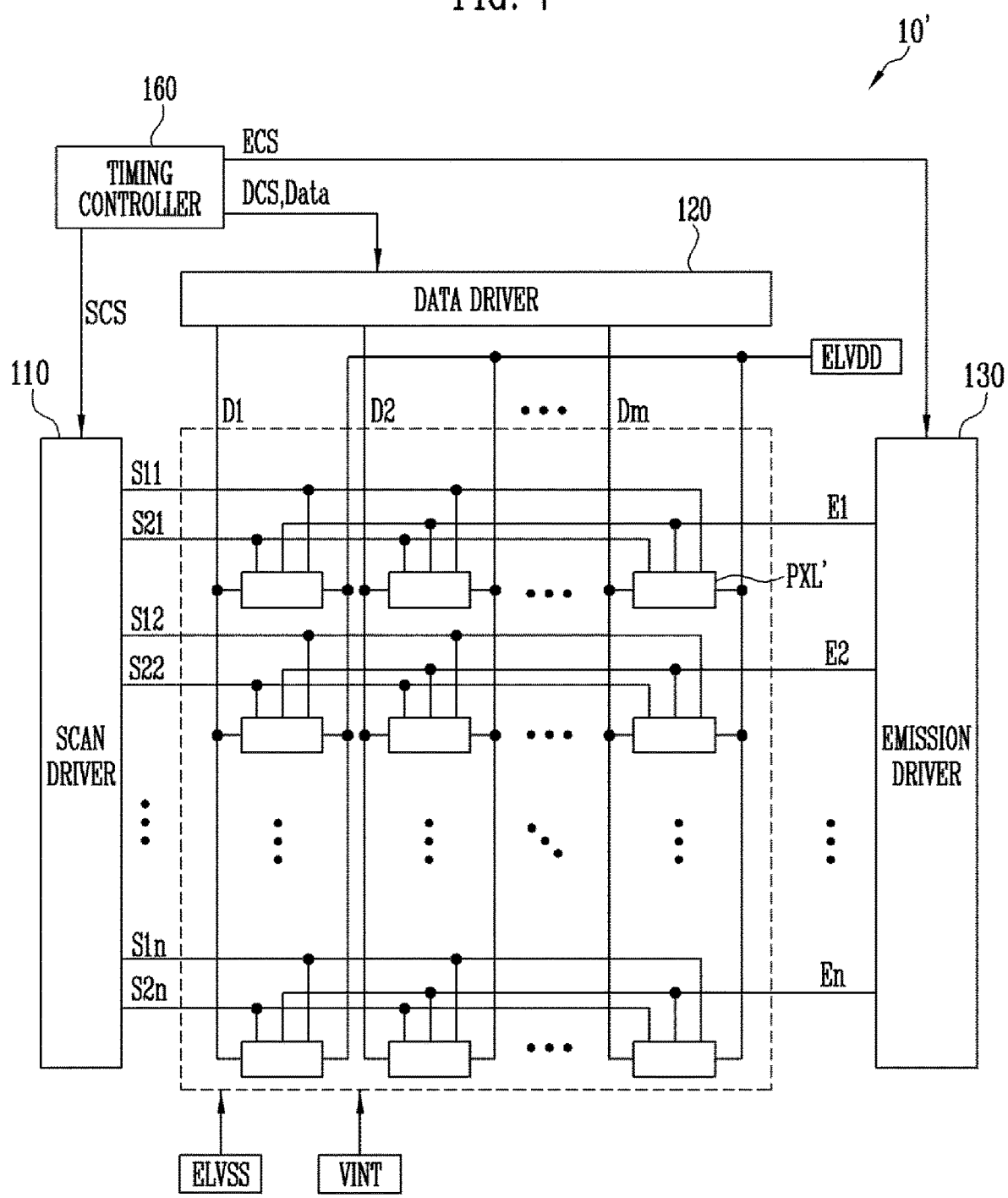
FIG. 7 is a diagram illustrating a display device according to another exemplary embodiment of the present disclosure.

FIG. 7 is a diagram illustrating a display device according to another exemplary embodiment of the present disclosure.

Referring to FIG. 7, a display device 10' according to another exemplary embodiment of the present disclosure has a similar configuration to that of the display device 10 illustrated in FIG. 1, but may further include second scan lines S21 to S2n.

In this case, pixels PXL' may be connected with first scan lines S11 to S1n, second scan lines S21 to S2n, emission control lines E1 to En, and data lines D1 to Dm.

That is, the pixels PXL' may be connected with the first scan lines S11 to S1n, the second scan lines S21 to S2n, and the emission control lines E1 to En in the unit of a horizontal line. Further, the pixels PXL' may be connected with the data lines D1 to Dm in the unit of a vertical line.

The scan driver 110 may supply first scan signals to the first scan lines S11 to S1n, and supply second scan signals to second scan lines S21 to S2n.

Figure 8:
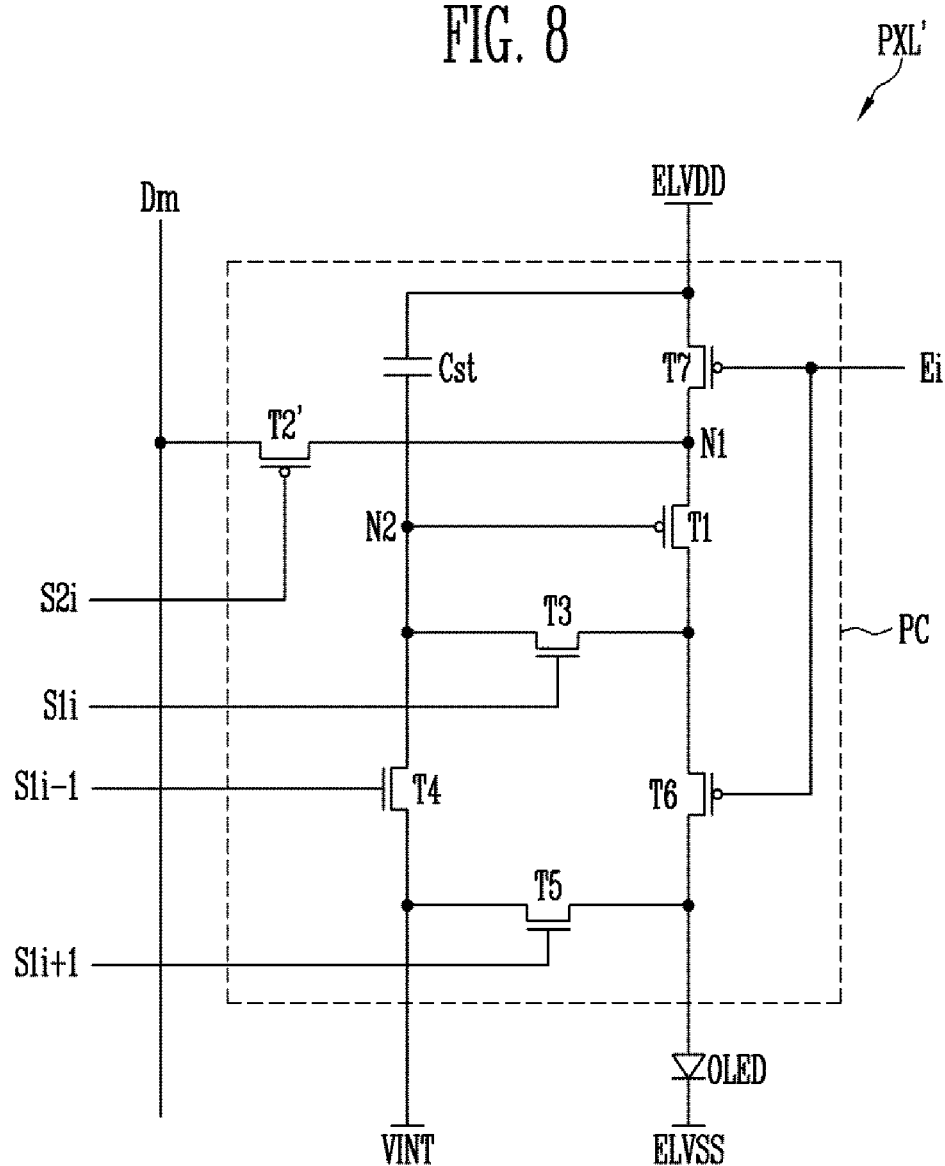
FIG. 8 is a diagram illustrating a pixel according to another exemplary embodiment of the present disclosure.

FIG. 8 is a diagram illustrating a pixel according to another exemplary embodiment of the present disclosure.

Referring to FIG. 8, a pixel PXL' according to another exemplary embodiment of the present disclosure is similar to the pixel PXL illustrated in FIG. 2, but a second transistor T2' may be formed of a P-type polysilicon transistor.

Accordingly, the second transistor T2' cannot share a control signal (for example, a first scan signal) of the third transistor T3, and may use a control signal (for example, a second scan signal) supplied through a separate i$^{th}$ second scan line S2i.

A gate electrode of the second transistor T2' may be connected to the i$^{th}$ second scan line S2i. The second transistor T2' may be turned on when the second scan signal is supplied to the i$^{th}$ second scan line S2i to electrically connect the m$^{th}$ data line Dm and the first node N1.

Figure 9:
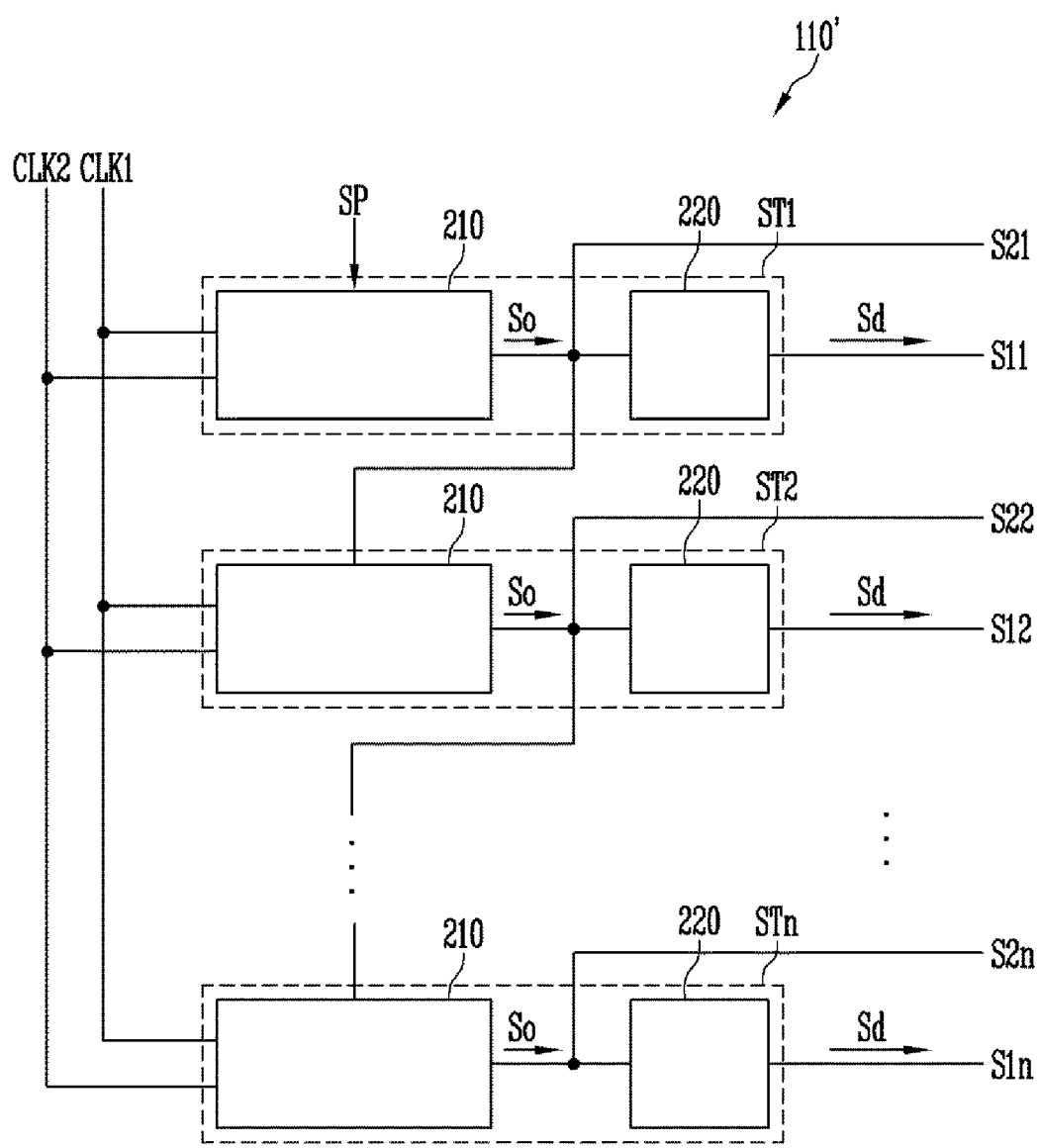
FIG. 9 is a diagram illustrating an inverter according to another exemplary embodiment of the present disclosure.

FIG. 9 is a diagram illustrating an inverter according to another exemplary embodiment of the present disclosure.

Referring to FIG. 9, driving circuit units 210 of stage circuits ST1 to STn may be connected to second scan lines S21 to S2n, respectively.

Accordingly, output signals So output from the driving circuit units 210 may be used as the aforementioned second scan signals.

Accordingly, a scan driver 110 may output first scan signals Sd and second scan signals So to first scan lines S11 to S1n and the second scan lines S21 to S2n.

In this case, it is not necessary to install a separate scan driver for generating the second scan signals, so that it is possible to decrease a dead space and manufacturing cost of the display device 10'.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
a plurality of pixels, a plurality of first scan lines, and a plurality of data lines, wherein the plurality of pixels are connected with the plurality of first scan lines and the plurality of data lines and each of the plurality of pixels comprises one or more polysilicon transistors and one or more oxide semiconductor transistors;
a plurality of second scan lines connected with the plurality of pixels;
a scan driver, wherein the scan driver comprises a plurality of stage circuits to supply a plurality of scan signals to the plurality of first scan lines and to supply a plurality of output signals to the plurality of second scan lines; and
a data driver configured to supply a plurality of data signals to the plurality of data lines,
wherein at least some of the plurality of stage circuits comprise:
a driving circuit unit configured to provide one of the plurality of output signals; and
an inverter configured to invert the output signal of the driving circuit unit and generate one of the plurality of scan signals, and
wherein:
the inverter comprises a first transistor and a second transistor,
the first transistor and the second transistor are configured for complementary operation,
the first transistor is a P-type polysilicon transistor,
the second transistor is an N-type oxide semiconductor transistor,
at least some of the one or more polysilicon transistors receives the output signal of the driving circuit unit through one of the plurality of second scan lines, and
at least some of the one or more oxide semiconductor transistors receives one of the plurality of scan signals through one of the plurality of first scan lines.

2. The display device of claim 1, further comprising a common node, a first driving power source, and a second driving power source, wherein for each stage circuit:
the first transistor is connected between the common node and the first driving power source,
the second transistor is connected between the common node and the second driving power source, and
the common node is electrically connected with one of the plurality of first scan lines to output one of the plurality of scan signals.

3. The display device of claim 1, wherein a channel width of the second transistor is larger than a channel width of the first transistor.

4. The display device of claim 1, wherein a channel length of the second transistor is smaller than a channel length of the first transistor.

5. The display device of claim 1, wherein the second transistor is a double gate transistor comprising two gate electrodes.

6. The display device of claim 1, wherein:
the driving circuit unit comprises a plurality of transistors, and
the plurality of transistors have the same conductive type.

7. The display device of claim 1, wherein:
the output signal of the driving circuit unit comprises a low level pulse, and
each of the plurality of scan signals comprises a high level pulse.

8. The display device of claim 1, wherein:
the one or more polysilicon transistors are P-type transistors, and
the one or more oxide semiconductor transistors are N-type transistors.

* * * * *